United States Patent [19]

Sciaky

[11] 4,162,391
[45] Jul. 24, 1979

[54] SLIDING VACUUM SEAL MEANS

[75] Inventor: Albert M. Sciaky, Palos Park, Ill.

[73] Assignee: Sciaky Bros., Inc., Chicago, Ill.

[21] Appl. No.: 861,988

[22] Filed: Dec. 19, 1977

[51] Int. Cl.² .............................................. B23K 9/00
[52] U.S. Cl. ............................................. 219/121 EB
[58] Field of Search ................. 219/121 EN, 121 EB, 219/72

[56] References Cited

U.S. PATENT DOCUMENTS

| | | | |
|---|---|---|---|
| 3,731,052 | 5/1973 | Ogawa | 219/121 EB |
| 3,742,365 | 6/1973 | Sciaky | 219/121 EB |
| 3,748,432 | 7/1973 | Bosworth et al. | 219/121 EB |
| 4,080,526 | 3/1978 | Kihara | 219/121 EB |

*Primary Examiner*—Bruce A. Reynolds
*Assistant Examiner*—Fred E. Bell
*Attorney, Agent, or Firm*—Julius L. Solomon

[57] ABSTRACT

A vacuum sealing means for a high production electron beam welding machine incorporating a rotary indexing table carrying parts to be welded from a loading position to a welding position under a stationery electron beam gun and then to an unloading station. Sealable pockets on the rotating index table carrying the parts to be welded are carried through a sealed off low volume space into a first pre-pumping station where air in the pocket is brought to a pressure intermediate between the atmospheric pressure and the pressure required during the welding of the parts. After pre-pumping, the pockets are indexed to a second pumped area where the pocket is evacuated to the pressure suitable for welding. The table is then indexed through an area at the pre-pumping pressure and then through another sealed off space at atmospheric pressure to the ejection station. The first and the last sealed off spaces at atmospheric pressure are means for preventing a large volume intake of air from the atmosphere surrounding the machine into the pumping system.

7 Claims, 7 Drawing Figures

SLIDING VACUUM SEAL MEANS

The present invention relates to apparatus for welding by means of an electron beam and more specifically, to an improved sealing method and system which allows a machine member carrying an electron beam gun to slide with respect to a vacuum chamber which is provided with a means whereby the electron beam generated in the electron gun may pass from the externally mounted electron gun into the evacuated chamber in which parts to be welded are mounted. The present invention is an improvement over that described in U.S. Pat. No. 3,742,365 issued June 26, 1973. In applications of the prior sealing system, in electron beam welding machines for use in high production industry to produce parts at high speeds on a continuous basis, a number of inconveniences have been experienced. This has been mainly, on machines which include a circular table which incorporates a number of sealable pockets disposed at equal distances from each other along a circle towards the edge of the circular table and a seal plate, against which the table slides so as to bring a different group of pockets to pre-determined positions under the seal plate intermittently. Parts to be electron beam welded are placed by an operator upon a suitable fixture within the pockets, the table caused to rotate by an automatic indexing mechanism which indexes the table intermittently from the loading position into a first pre-pumping station and then through a second pumped area where the pocket is evacuated to the pressure suitable for welding, to a position underneath an electron beam gun which generates the electron beam which joins the parts. During the welding operation, small particles of metal are thrown off from the weld area and when the table is indexed after each welding operation, the sudden flow of air into or out of each pocket causes the small metal particles to fly around and get into the corners and crevices of the tooling and into the pumps, causing excessive wear of the pump parts and making it necessary to disassemble some of the equipment for cleaning and maintenance purposes at which is considered to be too high a frequency.

The object of the present invention is to provide a vacuum pumping system and sliding seal means in an electron beam welding system in which the metal particles which form as a consequence of the welding process are not caused to be blown forcibly against the surfaces of the vacuum chamber, nor are they blown into the vacuum pumps.

Another object is to provide a system in which the scoring or grooving of the surface of the index table is minimized.

Another object is to provide a system in which the life of the vacuum seals is a maximum.

Another object is to reduce the time required for pumping down the system to the pressure required for welding.

The invention may better be understood by referring to the accompanying drawings.

Figure 1:
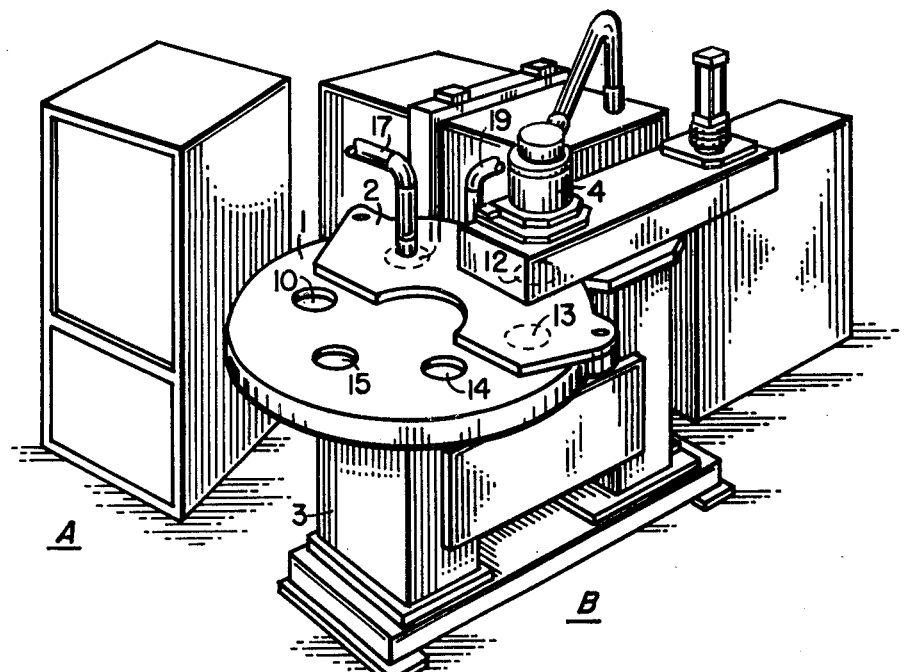
FIG. 1 is a perspective view of an electron beam welding machine incorporating the novel sliding seal means which utilizes a dial feed work transport mechanism for use in high production applications.

FIG. 1 illustrates an electron beam welding machine for use in high production industry to produce parts at high speeds on a continuous basis. The machine includes a circular table 1 which incorporates a number of sealable pockets 10 through 15 inclusive disposed at equal distances from each other along a circle towards the end of the circular table and a seal plate 2 against which the table slides so as to bring a different group of pockets to pre-determined positions under the seal plate intermittently. Parts to be electron beam welded may be placed upon a suitable fixture within the pocket at position "A" on the table "1" and the table caused to rotate by an automatic indexing mechanism "3" which indexes the table intermittently from the loading position past a sealed off space of small volume between the turntable and the seal plate into a first pre-pumping station and then through a second pump area to a position underneath the electron beam gun "4" where the pocket is pumped down to the pressure suitable for welding at which point the part is welded during the dwell time of the indexing mechanism. The part continues then to a pre-ejection area which is held at an intermediate pressure between the atmospheric and welding pressures and at the next index passes through a sealed off space of low volume to the ejection station "B" where it may be unloaded from the machine.

Figure 3:
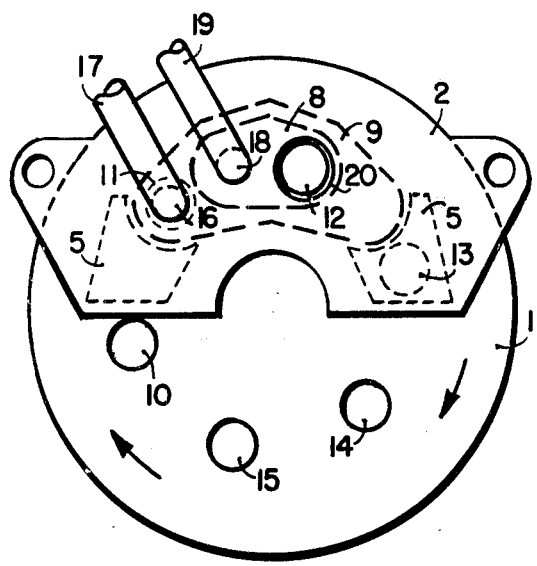
FIGS. 3 and 4 are top views of the rotating table and sliding seal arrangement in accordance with the prior art at two different relative positions between the rotating table and a fixed sliding seal arrangement.
Figure 4:
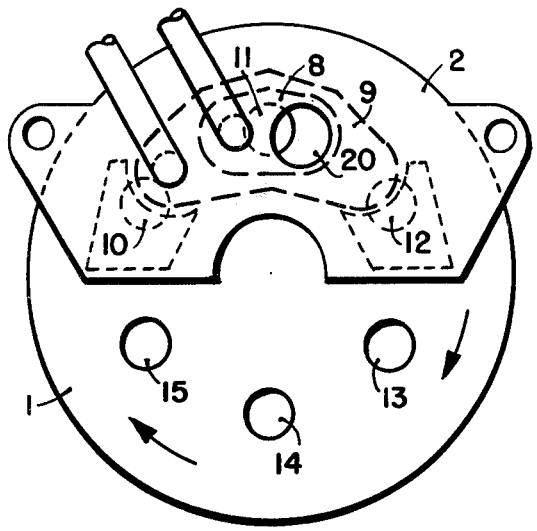

In the prior art, the vacuum seals are arranged on the seal plate "2" in the configuration shown by the lines broken by dots on FIGS. 3 and 4 marked "8 and 9" so as to form two separate volumes between the table "1" and the seal plate "2", an inner volume enclosed by the inner seal "8" and a second volume between the inner seal "8" and the outer seal "9". The inner seal closes off the area around the pocket containing the part when it is in the welding position under the gun. The second outer seal "9" seals off the volume surrounding the first seal "8". The seal plate "2" is connected to a first pumping means through a hole "16" in the seal plate and piping "17", which partially evacuates the pocket "11" which is at the first pumping station. A second pumping means through the tubing "19" and a second hole "18" in the seal plate evacuates the space enclosed by the inner seal "8". The electron beam gun housing is installed in a third hole "20" in the seal plate through which the electron beam may pass and is supported and sealed in such a way that the pocket carrying the piece part which is directly below the gun may easily be maintained at a pressure of approximately 50 microns.

Figure 2:
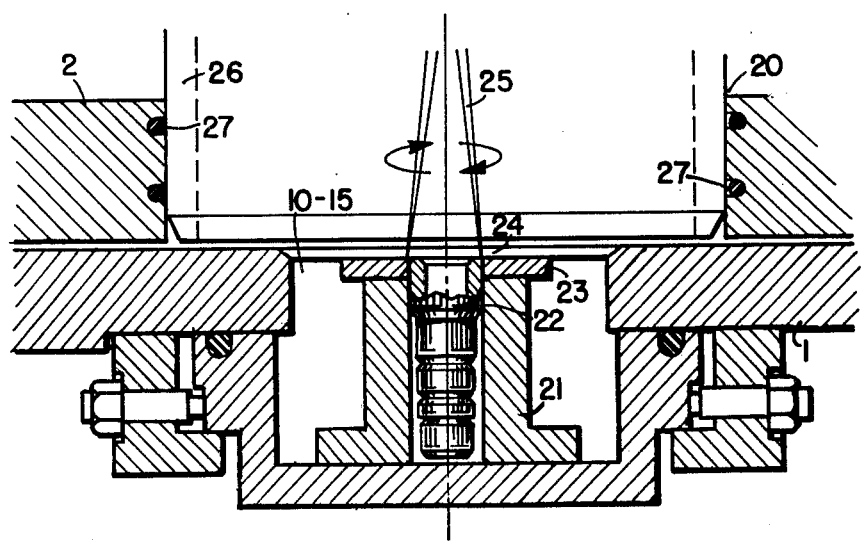
FIG. 2 illustrates a tooling pocket in position below one of the orifices on the rotating table of the welding machine.

FIG. 2 is a section taken at the welding station of a portion of the rotating table "1" showing one of the sealable pockets, 10 through 15, and tooling "21" used to hold the parts "22 and 23" being welded. In the case illustrated, the weld is made along the circular path "24" which defines the joint between the parts "22 and 23". The electron beam "25" is caused to traverse the circular path "24" through the action of suitable and well-known electron beam deflection means associated with the electron gun. The electron gun housing, "26", is fitted to the seal plate "2" through the hole "20" and is sealed to the seal plate with flexible seals "27" so that the space below the gun may be maintained at the desired gas pressure.

FIG. 3 illustrates the relative position of the seal plate "2" and the table "1" when the table is at rest after indexing. Pocket "12" is shown in the welding position centered under the electron beam port "20". While at rest pocket number 11 is being pre-pumped and pocket "12" is at the welding pressure of approximately 50 microns. At the next index, the table is rotated clockwise and pocket 10 which is at atmospheric pressure moves across the seal 9 and as pocket 10 crosses the leading edge of seal 9, the area between seal 8 and seal 9 is open to the full atmospheric pressure and there is a very rapid movement of air into this area and out through 17 as the pump attempts to pump down this area which is open to the atmosphere. This happens also as pocket "12" crosses the opposite edge of seal "9". The in-rush of air, like a compressed air jet, blows anything loose all around the pre-pump region and any metal particles lying loose in this region will be projected violently against all the surfaces and into the tooling crevices and into the roughing pump. In an attempt to ameliorate this condition, teflon pads "5" were placed to fill in the space between the rotating table and the seal plate in the area immediately ahead and behind the "0" ring seal "9". These pads did not inhibit the in-rush of air into the pre-pumping area, but did more harm in that any loose metalic particles which were ejected from the evacuated areas became embedded in the teflon pads and caused circumferential grooves to be cut into the surface of the table. These grooves created leaks between the sealed off low pressure areas and the atmosphere making it difficult to maintain proper vacuum conditions in the two separate sealed off spaces and caused a measurable increase in time required to pump down the system so that production was measurably reduced.

Figure 5:
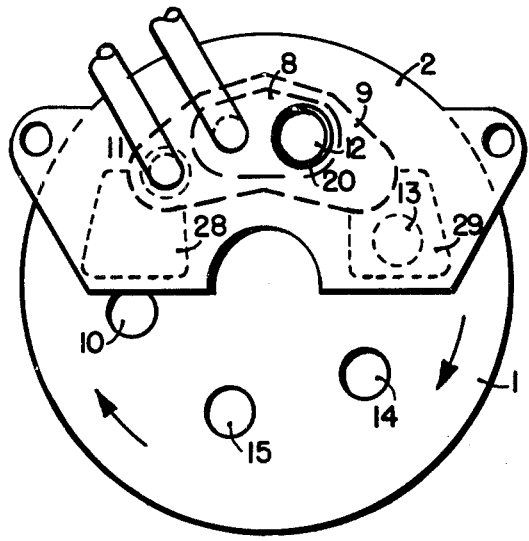
FIGS. 5 and 6 illustrate the rotating table and fixed sliding seal arrangement in accordance with the new invention at two different positions of the rotating table.
Figure 6:
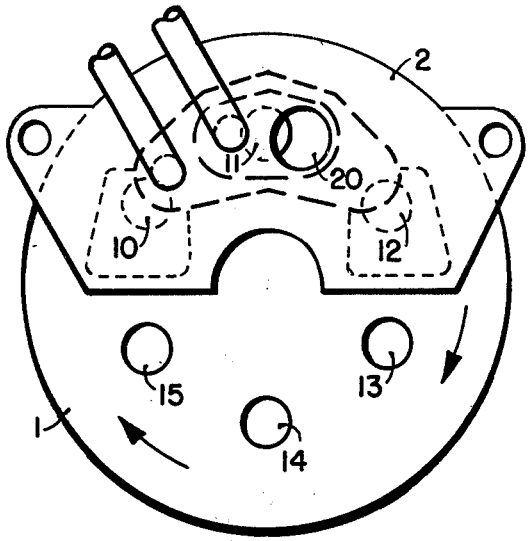

FIGS. 5 and 6 illustrate the new method by which the above inconveniences were overcome. Seals "8" and "9" are utilized as in the prior art.

Two additional seals, 28 and 29, are mounted upon the seal plate so as to enclose two volumes which are sealed off from the atmosphere and from the first two sealed spaces, one at one end and the other at the other end of the spaces sealed off by seals 8 and 9. These two spaces are not pumped separately. These two dead seal spaces affect the operation of the sealing system in the following manner during the time that the rotating table indexes from one position to the next. FIG. 5 illustrates "at rest" position of the table, when the welding is performed. After the welding operation, the turntable is put into motion in the clockwise direction, pocket 12, which has been in the welding position, moves in the clockwise direction and as it crosses the seal 9, it leaves the pre-pumped space and enters the dead seal space, thus connecting the dead seal space to the pre-pumped space between seals 8 and 9. The dead seal space has a volume which is small in relation to the volume of the pocket. There is very little movement of air from the dead seal space into the mechanical pump which evacuates the pre-pump space. Because of this, there is no agitation of any particles that might be in this space. Pocket 10 moves towards the weld area, enters the dead seal space on the left, continues on and at its leading edge, crosses the left edge of seal 9 and connects the pre-pumped space to the dead seal space, but since the volume surrounded by the dead seal is very small, there is no great in rush of air from the atmosphere into the pre-pumping space and the dead seal space air pressure is reduced to the pressure in the pre-pumping space and there is no burden of in rushing air into the vacuum pump and the pressure does not increase and the air in pocket 10 is quickly removed by the mechanical pump connected to pipe 17. As each pocket passes across the leading edge of seal 28, the air in the dead seal space is brought to or maintained at atmospheric pressure. As the pocket continues its motion, it becomes completely enclosed by the dead seal space. The pocket then crosses into the pre-pumped area with the volume to be exhausted being only the volume of the pocket plus the small additional volume enclosed by seal 28 and the left end of seal 9. When the pocket leaves the welding area, it traverses the right hand edge of seal 9 and connects the small volume surrounded by seal 29 to the pre-pumped area. This small volume of air at atmospheric pressure, however, does not impose a serious strain upon the mechanical pump connected to pipe 17 and creates no turbulance in the sealed space. The small metal particles are not blown forcibly against all surfaces, nor are they blown into the roughing pumps. Since the teflon pads are not necessary, the small metallic particles are not embedded and cannot act like cutting tools and scoring of the table is eliminated. Because the air from the atmosphere does not have a free and continuous entrance into the pre-pumping space during the transition period of the pockets the pump down time for each pocket is greatly reduced and the machine can be operated at higher production rates.

Figure 7:
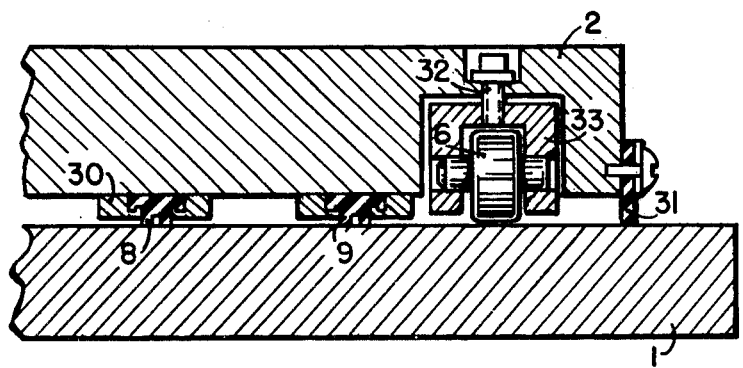
FIG. 7 is a section of a portion of the rotating table and the sliding seal and its support.

FIG. 7 is a cross section of a portion of the rotating table and seal plate arrangement, the rotating table 1 is maintained at a fixed distance from the seal plate "2" by a number of rollers "6". The endless seals, 8 and 9, are held in place by means of brackets "30" which support all the seals, 8, 9, 28, and 29 along their full length. A wiping seal "31" about the periphery of the edge of the seal plate is fastened to the edge of the seal plate by means of screws. The roller support "33" is provided with a screw means for adjusting the roller position with respect to the seal plate so that the force with which the seals bear upon the rotating table may be adjusted.

Although specific forms have been illustrated to describe the invention, the invention is not limited to these forms or to such modification of them as may be obvious to the skilled man of the art.

What I claim is:

1. An electron beam welding machine for the continuous welding of parts in series comprising a circular table, a seal plate disposed above said circular table, sealable pockets arranged equi-distant from each other adjacent the outer edge of the said table, means within said pockets for supporting workpieces to be welded by an electron beam, means for rotating the said table in a step wise fashion against a sealing arrangement comprising "N" number of continuous flexible seals mounted upon the said seal plate one surrounding the next so as to form "N" number of sealed spaces between the table and the seal plate, additional continuous resilient seals surrounding areas adjacent to each end of the outermost of the aforementioned sealed spaces, means for positioning one of said pockets so that it communicates with the innermost of the aforementioned sealed spaces which is maintained at a desired welding pressure while the following N-1 pockets are positioned so that they communicate each with a separate space which is maintained at a pressure intermediate to the atmospheric pressure and the welding pressure, means for generating, focusing and deflecting a beam of electrons, and means for indexing each of said pockets in sequence into a position under the said electron beam means for a pre-set interval of time.

2. An electron beam welding machine as in claim 1 wherein the said set of flexible seals comprises, at least two endless resilient flexible sealing means supported on a single plane of the said fixed member and arranged so that each one is positioned wholly within the one next largest so as to form separate sealed spaces bounded by the innermost of said flexible sealing means and the said fixed and movable members and between each pair of adjacent seals and the said fixed and movable members, additional flexible sealing means lying in the said plane fastened at each end of the outermost endless flexible seal so as to form two additional sealed off spaces at each end of the outermost of the said endless resilient flexible sealing means in the aforementioned single plane, the said set of sealing means being so arranged that the said pockets in the said rotating table will communicate with each sealed off area completely and in sequence through each area as the table is rotated with respect to the sealing plate.

3. An electron beam welding machine as in claim 1 wherein the said set of flexible seals comprises, at least two endless resilient flexible sealing means supported on a single plane of the said fixed member and arranged so that each one is positioned wholly within the one next largest so as to form separate sealed spaces bounded by the innermost of said flexible sealing means and the said fixed and movable members and between each pair of adjacent seals and the said fixed and movable members, additional resilient flexible sealing means comprising a first length of flexible seal whose ends are fastened to the outer wall of the outermost seal across that of the said outermost seal that is traversed by the edge of the said pockets, and a second length of flexible seal attached in like manner at the opposite end of the outermost flexible seal, so as to form two additional sealed off spaces at each end of the outermost of the said endless resilient flexible sealing means in the aforementioned single plane, the said set of sealing means being so arranged that the said pockets in the said rotating table will communicate with each sealed off area completely and in sequence through each area as the table is rotated with respect to the sealing plate.

4. An electron beam welding machine as in claim 3 in which the gas pressure in the innermost space is maintained at approximately 50 microns and the gas pressure in the second space between the two said seals is maintained at a pressure intermediate to 50 microns and the atmospheric pressure.

5. An electron beam welding machine as in claim 1 in which each of the first mentioned separate sealed spaces communicates with a separate vacuum pump.

6. An electron beam welding machine as in claim 1 in which each of the said first mentioned separate sealed spaces is maintained at a progressively lower gas pressure with the highest pressure in the outermost spaces.

7. An electron beam welding machine as in claim 1 comprising two of said endless flexible sealing means.

* * * * *